(12) United States Patent
Das et al.

(10) Patent No.: US 11,886,987 B2
(45) Date of Patent: Jan. 30, 2024

(54) NON-VOLATILE MEMORY-BASED COMPACT MIXED-SIGNAL MULTIPLY-ACCUMULATE ENGINE

(71) Applicant: Arm Limited, Cambridge (GB)

(72) Inventors: Shidhartha Das, Upper Cambourne (GB); Matthew Mattina, Boylston, MA (US); Glen Arnold Rosendale, Palo Alto, CA (US); Fernando Garcia Redondo, Cambridge (GB)

(73) Assignee: Arm Limited, Cambridge (GB)

( * ) Notice: Subject to any disclaimer, the term of this patent is extended or adjusted under 35 U.S.C. 154(b) by 922 days.

(21) Appl. No.: 16/451,205

(22) Filed: Jun. 25, 2019

(65) Prior Publication Data
US 2020/0410333 A1 Dec. 31, 2020

(51) Int. Cl.
*G06N 3/065* (2023.01)
*G06N 3/04* (2023.01)
*G06N 3/08* (2023.01)

(52) U.S. Cl.
CPC .............. *G06N 3/065* (2023.01); *G06N 3/04* (2013.01); *G06N 3/08* (2013.01)

(58) Field of Classification Search
CPC .......... G06N 3/0635; G06N 3/04; G06N 3/08; G06N 3/0454; G06F 2207/4814; G06F 7/5443; G11C 11/54; G11C 2213/77
See application file for complete search history.

(56) References Cited

U.S. PATENT DOCUMENTS

| 2015/0067273 A1* | 3/2015 | Strauss | ................. G06F 9/5066 711/147 |
| 2018/0247192 A1* | 8/2018 | Fick | ......................... G06J 1/00 |

(Continued)

FOREIGN PATENT DOCUMENTS

GB        2552014 A        1/2018

OTHER PUBLICATIONS

Ping Chi, "Processing-in-Memory in ReRAM-based Main Memory", SEAL-lab Technical Report—No. 2015-001 (Apr. 29, 2016) (Year: 2016).*

(Continued)

*Primary Examiner* — Ying Yu Chen
*Assistant Examiner* — Imad Kassim
(74) *Attorney, Agent, or Firm* — Leveque Intellectual Property Law, P.C.

(57) ABSTRACT

A multiply-accumulate method and architecture are disclosed. The architecture includes a plurality of networks of non-volatile memory elements arranged in tiled columns. Logic digitally modulates the equivalent conductance of individual networks among the plurality of networks to map the equivalent conductance of each individual network to a single weight within the neural network. A first partial selection of weights within the neural network is mapped into the equivalent conductances of the networks in the columns to enable the computation of multiply-and-accumulate operations by mixed-signal computation. The logic updates the mappings to select a second partial selection of weights to compute additional multiply-and-accumulate operations and repeats the mapping and computation operations until all computations for the neural network are completed.

21 Claims, 6 Drawing Sheets

(56) References Cited

U.S. PATENT DOCUMENTS

2019/0042915 A1* 2/2019 Akin ............... G06N 3/063
2020/0242461 A1* 7/2020 Tran ............... G06N 3/0481

OTHER PUBLICATIONS

Ni et al. ("An Energy-Efficient Digital ReRAM-Crossbar-Based CNN With Bitwise Parallelism," in IEEE Journal on Exploratory Solid-State Computational Devices and Circuits, vol. 3, pp. 37-46, Dec. 2017) (Year: 2017).*

Karakiewicz et al. ("480-GMACS/mW Resonant Adiabatic Mixed-Signal Processor Array for Charge-Based Pattern Recognition", IEEE Journal of Solid-State Circuits, vol. 42, No. 11, Nov. 2007) (Year: 2007).*

Merrikh-Bayat et al ("High-Performance Mixed-Signal Neurocomputing With Nanoscale Floating-Gate Memory Cell Arrays", IEEE Transactions on Neural Networks and Learning Systems, vol. 29, No. 10, Oct. 2018) (Year: 2018).*

Chi et al. ("PRIME: A Novel Processing-in-memory Architecture for Neural Network Computation in ReRAM-based Main Memory", 2016 ACM/IEEE) (Year: 2016).*

Chakma et al. ("Memristive Mixed-Signal Neuromorphic Systems: Energy-Efficient Learning at the Circuit-Level", IEEE, vol. 8, No. 1, Mar. 2018) (Year: 2018).*

Changhyuck Sung, Seokjae Lim, Hyungjun Kim, Taesu Kim, Kibong Moon, Jeonghwan Song, Jae-Joon Kim and Hyunsang Hwang, "Effect of conductance linearity and multi-level cell characteristics of TaOx-based synapse device on pattern recognition accuracy of neuromorphic system," Nanotechnology, vol. 29, No. 11, Feb. 6, 2018.

Fernando Garcia-Redondo and Marisa López-Vallejo, "Self-controlled multilevel writing architecture for fast training in heuromorphic RRAM applications," Nanotechnology, vol. 29, No. 40, Jul. 31, 2018.

Hu, M., Graves, C. E., Li, C., Li, Y., Ge, N., Montgomery, E., Davila, N., Jiang, H., Williams, R. S., Yang, J. J., Xia, Q., Strachan, J. P., "Memristor-Based Abalog Computation and Neural Network Classification with a Dot Product Engine," Adv. Mater. 2018, 30, 1705914.

J. Woo, K. Moon, J. Song, M. Kwak, J. Park and H. Hwang, "Optimized Programming Scheme Enabling Linear Potentiation in Filamentary HfO2 RRAM Synapse for Neuromorphic Systems," in IEEE Transactions on Electron Devices, vol. 63, No. 12, pp. 5064-5067, Dec. 2016.

Ping et al., "Processing-in-Memory in ReRAM-based Main Memory," SEAL-lab Technical Report, No. 2015-001, Nov. 30, 2015.

* cited by examiner

NON-VOLATILE MEMORY-BASED COMPACT MIXED-SIGNAL MULTIPLY-ACCUMULATE ENGINE

BACKGROUND

The present disclosure relates generally to machine-learning accelerators, and more particularly, to a mixed signal multiply-accumulate engine for improving the efficiency of machine learning operations.

Non-Volatile Memory (NVM)-based crossbar architectures provide an alternative mechanism for performing multiply-accumulate (MAC) operations in machine-learning algorithms, particularly, neural-networks. The mixed-signal approach using NVM bit-cells relies upon Ohm's law to implement multiply operations by taking advantage of the resistive nature of emerging NVM technologies (e.g., phase change memory (PCM), resistive random access memory (RRAM), correlated electron random access memory (CeRAM), and the like). An application of a voltage-bias across an NVM-bit cell generates a current that is proportional to the product of the conductance of the NVM element and the voltage-bias across the cell.

Currents from multiple such bit cells can then be added in parallel to implement an accumulated sum. Thus, a combination of Ohm's law and Kirchoff's current law implements multiple MAC operations in parallel. These can be energy-intensive when implemented using explicit multipliers and adders in the digital domain.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1A:
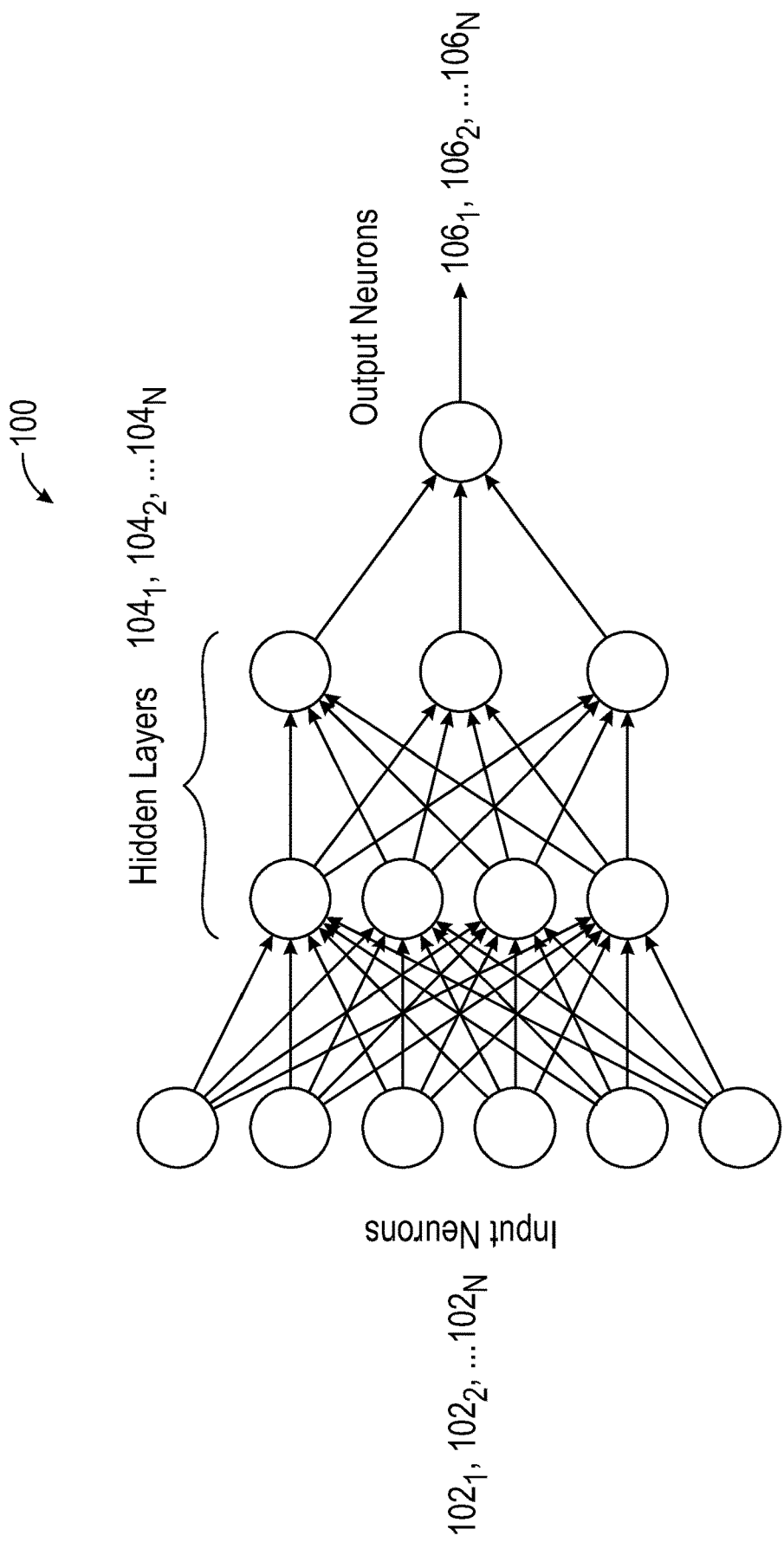
FIGS. 1A and 1B depict a high-level representation of a neural network.

In accordance with the present disclosure, there is provided improved NVM crossbar architectures that provide energy-efficient acceleration of the analog-compute operation while reducing the attendant area and yield impact inherent in the known approaches.

Specific embodiments of the disclosure will now be described in detail regarding the accompanying figures. For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

In the following detailed description of embodiments of the disclosure, numerous specific details are set forth in order to provide a more thorough understanding of the disclosure. However, it will be apparent to those skilled in the art that the disclosure may be practiced without these specific details. In other instances, well-known features have not been described in detail to avoid unnecessarily complicating the description.

It is to be understood that the terminology used herein is for the purposes of describing various embodiments in accordance with the present disclosure and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period.

As used herein, the terms "about", "approximately" or "substantially apply to all numeric values, irrespective of whether these are explicitly indicated. Such terms generally refer to a range of numbers that one of skill in the art would consider equivalent to the recited values (i.e., having the same function or result). These terms may include numbers that are rounded to the nearest significant figure. In this document, any references to the term "longitudinal" should be understood to mean in a direction corresponding to an elongated direction of a personal computing device from one terminating end to an opposing terminating end.

Figure 1B:
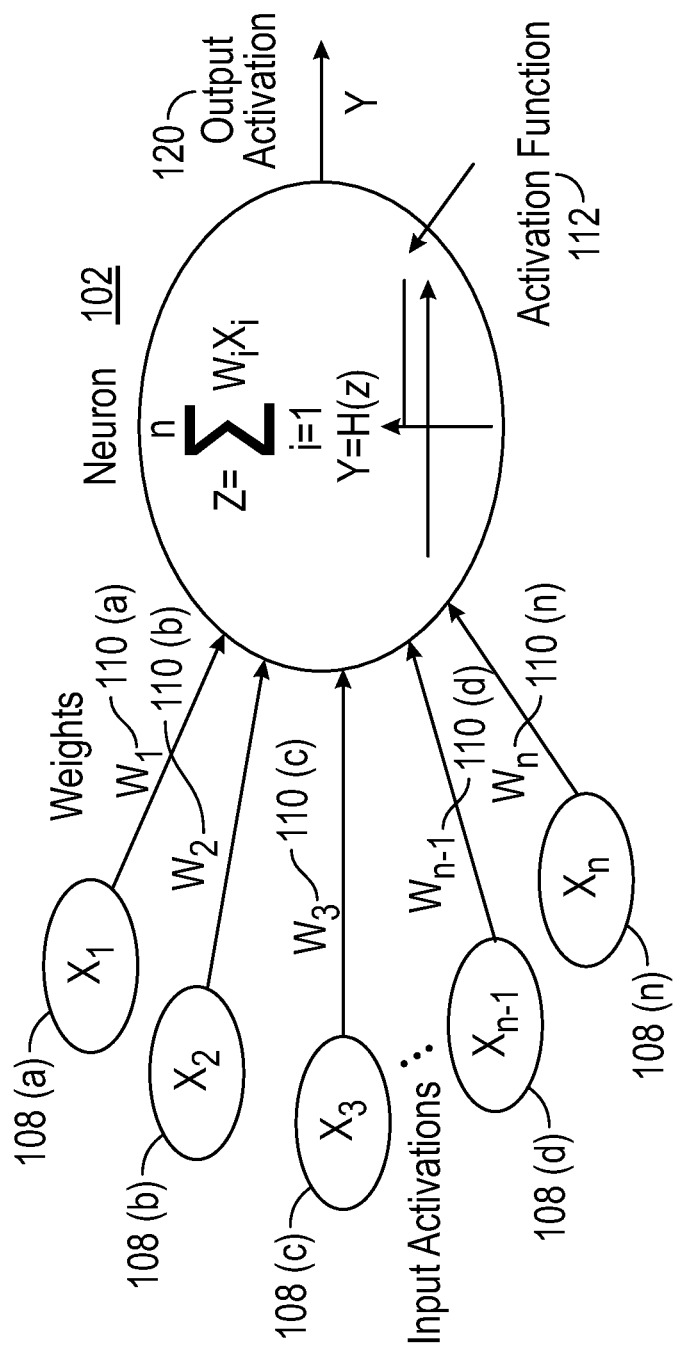

FIGS. 1A and 1B are diagrams of a neural network. FIG. TA shows an example of a neural network 100, which generally includes a plurality of input neurons $102_1$, $102_2$, ..., $102_N$ (where "N" is any suitable number), hidden layers $104_1$, $104_2$, ... $104_N$ (where "N" is any suitable number) and output neurons $106_1$, $106_2$, ..., $106_N$ (where "N" is any suitable number).

FIG. 1B depicts a plurality of input activations represented by $X_1, X_2, X_3, X_{n-1}, ..., X_n$ that have corresponding weights $W_1, W_2, W_{n-1}, ..., W_n$ (where "n" is any suitable number) $108(a), 108(b), 108(c), 108(d), ..., 108(n)$, respectively, that correspond to each neuron $102_1$, $102_2$, ..., $102_N$, respectively, shown in FIG. 1A. An activation function 112 for a corresponding neuron outputs an output activation Y, which can be (but is not limited to) a step function H whose output Y is a constant value if the input sum is above a threshold, and zero (or a different constant value) if the input sum is below that same threshold.

Figure 2:
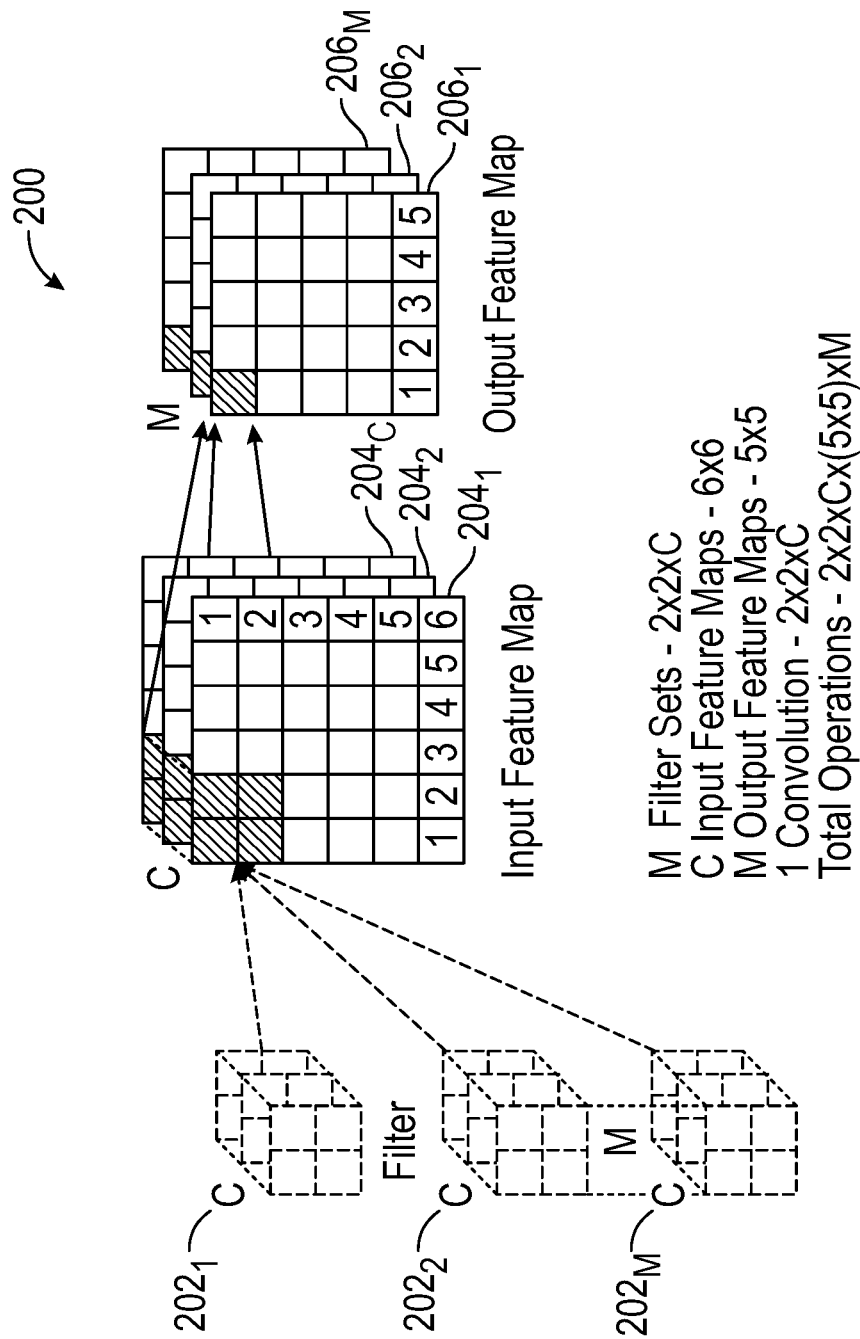
FIG. 2 is an illustration of a convolution operation within a single-layer of a convolutional neural network.

FIG. 2 shows a convolution operation within a single-layer of a convolutional neural network (CNN) 200. In this example, there are "C" input channels and "M" filter sets $202_1, 202_2, ..., 200_M$. Each filter set has "C" filters, one filter for each input channel. Filter sets $202_1, 202_2, \ldots, 202_m$ are convolved across "C" input feature maps $204_1, 204_2, \ldots, 204_C$ to produce "M" output feature maps $206_1, 206_2, \ldots, 206_M$, each output feature map corresponding to a single filter set. In the illustration of FIG. 2, it is assumed that the dimensions of the filters is 2×2, the dimensions of the filter sets are 2×2×C, and the dimensions of the input feature maps are 6×6. Thus, the total number of operations are 2×2×C×(5×5)×M for the specific illustration shown in FIG. 2.

Figure 3:
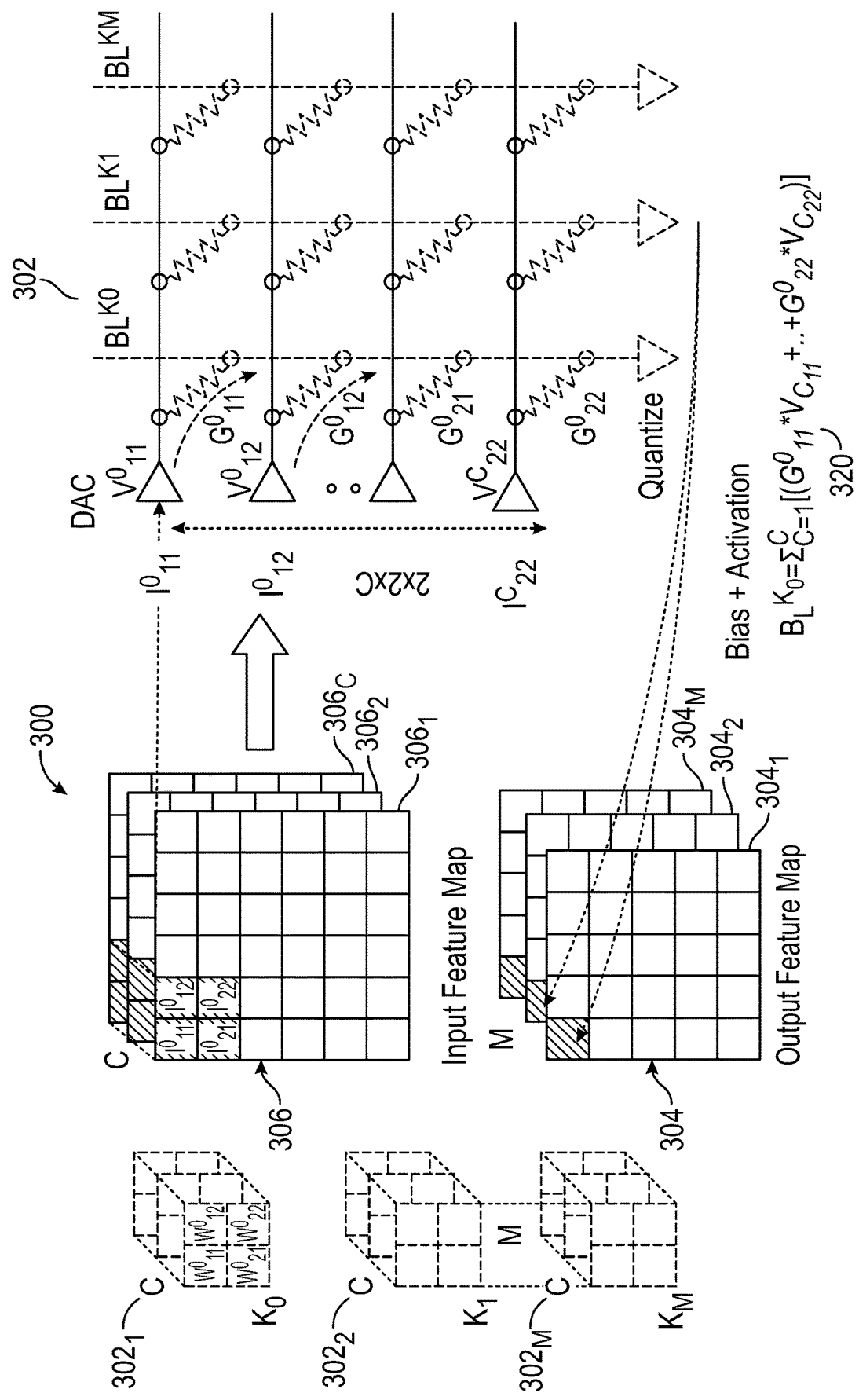
FIG. 3 is a depiction of an architecture for performing the convolution operation using NVM crossbars.

FIG. 3 illustrates an architecture 300 showing how such an operation can be implemented using NVM crossbars 302. Reference numerals identifying like components are repeated from FIG. 2.

In the crossbar 302, weights for a convolutional filter are programmed into individual bit-cells $W^o{}_{11}$, $W^o{}_{12}$, $W^o{}_{21}$, $W^o{}_{22}$ (as shown by $302_1$). It is useful to encode multiple linearly-separated resistance levels within an individual bit cell due to the wide separation between low-resistance state (LRS) and the high-resistance state (HRS). For instance, in case of the CeRAM, the ratio of HRS/LRS is at least 2-orders of magnitude. Therefore, encoding a 4-bit (or 16 levels) resistance is possible. Digital words from the input feature maps $306_{1 \ldots N}$ are then converted to an analog-voltage using a digital-to-analog convertor (DAC) 302, which is then applied across the NVM cell. The resultant current is therefore proportional to the dot-product of the input word and the weight. These individual currents are then accumulated in parallel on a bit line. Once the accumulated current signal develops on the bit line, it can then be digitized again using an analog-to-digital converter (ADC) and bias-addition, scaling and activation-functions 320 can be applied on the resulting digital word to obtain output activation.

In FIG. 3, there is illustrated a mapping of CNN to NVM crossbars with M filters and C input channels. In the known technique, it may be assumed that the weights ω are stationary i.e., they are programmed into the crossbar once and typically do not change during the course of inference operations. Typical NVM elements (for instance, Phase-Change Memory and Resistive RAM) have a limited write "endurance"—i.e., it is possible to write to them a limited number of times (for example, approximately $10^8$ times) after which the crossbars can exhibit functional failure. Other NVM elements (such as Magnetic RAM and CeRAM) demonstrate the promise for relatively higher endurance (near $10^{12}$), but continuous operation still leads to a limited lifetime. Hence, such lifetime limits pose significant constraints on accelerator architectures that rely upon updating weights on a per-inference cycle. For example, for an Internet of Things (IoT)-class accelerator operating at 100 MHz, an accelerator with an endurance of $10^8$ has a lifetime of 1 second, and an accelerator with an endurance of $10^{12}$ has a lifetime of 10,000 secs or 4 days (worst-case, peak usage). Therefore, such weights cannot be practically streamed from an external DRAM and must be fixed on-chip. Further, NVM bit cells can suffer from high write-powers, and consequent expensive power consumption to perform update operations. Thus, the write phase can be problematic and take a long time to complete.

Such arrangements differ from SRAM behavior (which has significantly higher write endurance) and are not amenable to reprogramming the weights during inference. As a consequence, the entire network is unrolled into an on-chip crossbar and fixed during inference. While this has the advantage of eliminating DRAM power consumption, it can undesirably limit the maximum size of the network that can be programmed on-chip. Further, it also typically incurs an area penalty as mapping larger networks involves instantiation of crossbars that are megabits in capacity. This consumes higher area and increases susceptibility to chip-failures due to yield loss. Moreover, instantiating multiple crossbars involves instantiation of multiple ADCs/DACs, all of which need to be programmed, trimmed and compensated for drift.

A method and architecture for performing multiply-accumulate computation in a neural network is disclosed. The architecture includes a plurality of networks of non-volatile memory elements arranged in tiled columns. Additional control circuitry is provided that modulates the equivalent conductance of individual networks among the plurality of networks to map the equivalent conductance of each individual network to a single weight within the neural network. A first partial selection of weights within the neural network is mapped into the equivalent conductances of the networks in the tiled columns to enable the computation of multiply-and-accumulate operations by mixed-signal computation. Control logic updates the mappings to select a second partial selection of weights to compute additional multiply-and-accumulate operations and then repeats the mapping and computation operations until desired computations for the neural network are completed. In some embodiments, the neural network is of a size that can be mapped entirely to the plurality of networks of non-volatile memory elements.

In accordance with another embodiment, the multiply-accumulate architecture includes a plurality of transistors and resistors operable to select the plurality of weights as binary weights in conductances.

In accordance with yet another embodiment, non-volatile memory resistance is operable to singularly perform computations.

In accordance with a further embodiment, the multiply-accumulate is implemented in an analog mixed mode domain.

In accordance with an embodiment, an external random-access memory is disposed off-chip, and the plurality of weights are streamed from the external random-access memory.

In accordance with a further embodiment, the external random-access memory is one of a dynamic random-access memory and a pseudo-static random-access memory.

In accordance with another embodiment, there is provided an analog-to-digital converter operable to multiplex the outputs of the respective tiled columns.

In accordance with yet another embodiment, a neuron is composed of the plurality of tiled columns.

In accordance with still a further embodiment, there is provided correlated electron random-access memory operable to perform the multiply-accumulate operation.

In accordance with another embodiment, there is provided a method for multiply-accumulate operations in a network. The method includes, in a plurality of networks of non-volatile memory elements arranged in tiled columns: digitally modulating the equivalent conductance of individual networks among the plurality of networks to map the equivalent conductance of each individual network to a single weight within the neural network, a first partial selection of weights within the neural network being mapped into the equivalent conductances of the networks in the tiled columns to enable the computation of multiply-and-accumulate operations by mixed-signal computation; updating the mappings to select a second partial selection of weights to compute additional multiply-and-accumulate operations; and repeating the mapping and computation operations until all computations for the neural network are completed.

The present disclosure provides a scheme for energy-efficient acceleration of the analog-compute. Specifically, there is incorporated a fundamental split between the compute operation and the storage operation in NVM. In accordance with embodiments of the disclosure, the NVM crossbar is utilized for the compute operation. Accordingly, instead of instantiating an explicit MAC and accumulator, embodiments in accordance with the disclosure provide analog-domain multiplication and accumulation. Since the weights that are traditionally fixed are not switchable using digital logic, these weights can now be swapped in at high-frequencies (as fast as transistors can switch) independent of explicit reprogramming.

Figure 4:
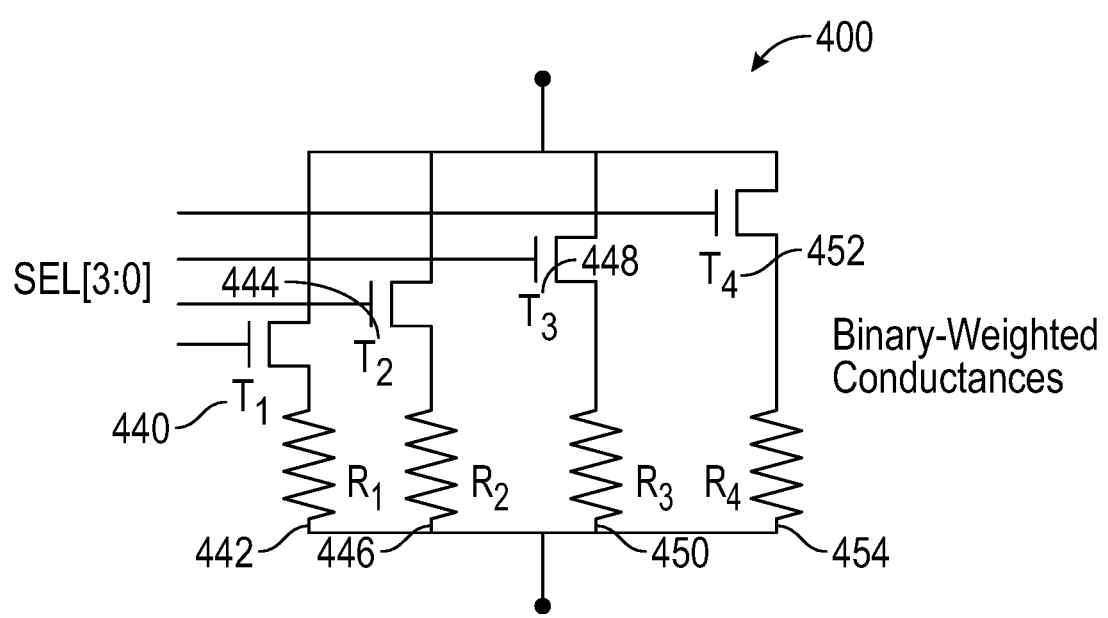
FIG. 4 is a schematic circuit for digitally encoding weights using conductances in accordance with an embodiment of the disclosure.

Weight encoding is performed in the digital domain, thereby increasing the robustness to variation issues. With reference now to FIG. 4, there is depicted a representation of a schematic circuit 400 that illustrates weights digitally encoded using conductances. The circuit 400 is represented as a schematic and includes a plurality of resistors $R_1$ 442, $R_2$ 446, $R_3$ 450, $R_4$ 454, and transistors denoted by $T_1$ 440, $T_2$ 444, $T_3$ 448, and $T_4$ 452. The circuit 400 is merely illustrative and may be configured with any suitable combination of resistors and transistors in accordance with embodiments of the disclosure. Each equivalent weight is created using an equivalent network of conductances. In the specific example shown in FIG. 4, a parallel network of NVM elements is shown, where each element has a conductance "G". Thus, a 4-bit digital bus can switch between 1G, 2G, 3G and 4G conductances, thereby enabling a 2-bit weight. Similarly, 8 resistances can enable 3-bit weights, and 16 resistances can enable 4-bit weights.

Alternatively, the conductances themselves can be programmed to be binary-weighted. In one scheme of weight encoding, the borne-ON LRS resistances for CeRAM can work independent of reprogramming. In accordance with embodiments of the disclosure, the compute and memory phases are separated into distinct categories. The NVM resistance may be employed for computational purposes. Weight memory is streamed in from an external storage location, such as DRAM or PSRAM. The MAC operation is thereby achieved in compact fashion by utilizing a CeRAM/NVM element with its selector device and independent of an explicit multiplier. Each circuit 400 corresponds to an individual network within the neural network as further illustrated in FIG. 5. As described in co-pending U.S. patent application Ser. No. 15/884,612, assigned to the Assignee of the present application, the disclosure of which is incorporated by reference herein, a NVM/CeRAM element is a particular type of random access memory formed (wholly or in part) from a correlated electron material (CEM). The CeRAM may exhibit an abrupt conductive or insulative state transition arising from electron correlations rather than solid state structural phase changes such as, for example, filamentary formation and conduction in resistive RAM devices. An abrupt conductor/insulator transition in a CeRAM may be responsive to a quantum mechanical phenomenon, in contrast to melting/solidification or filament formation.

A quantum mechanical transition of a CeRAM between an insulative state and a conductive state may be understood in terms of a Mott transition. In a Mott transition, a material may switch from an insulative state to a conductive state if a Mott transition condition occurs. When a critical carrier concentration is achieved such that a Mott criterion is met, the Mott transition will occur and the state will change from high resistance/impedance (or capacitance) to low resistance/impedance (or capacitance).

A "state" or "memory state" of the CeRAM element may be dependent on the impedance state or conductive state of the CeRAM element. In this context, the "state" or "memory state" means a detectable state of a memory device that is indicative of a value, symbol, parameter or condition, just to provide a few examples. In a particular implementation, a memory state of a memory device may be detected based, at least in part, on a signal detected on terminals of the memory device in a read operation. In another implementation, a memory device may be placed in a particular memory state to represent or store a particular value, symbol or parameter by application of one or more signals across terminals of the memory device in a "write operation."

A CeRAM element may comprise material sandwiched between conductive terminals. By applying a specific voltage and current between the terminals, the material may transition between the aforementioned conductive and insulative states. The material of a CeRAM element sandwiched between conductive terminals may be placed in an insulative state by application of a first programming signal across the terminals having a reset voltage and reset current at a reset current density, or placed in a conductive state by application of a second programming signal across the terminals having a set voltage and set current at set current density.

Figure 5:
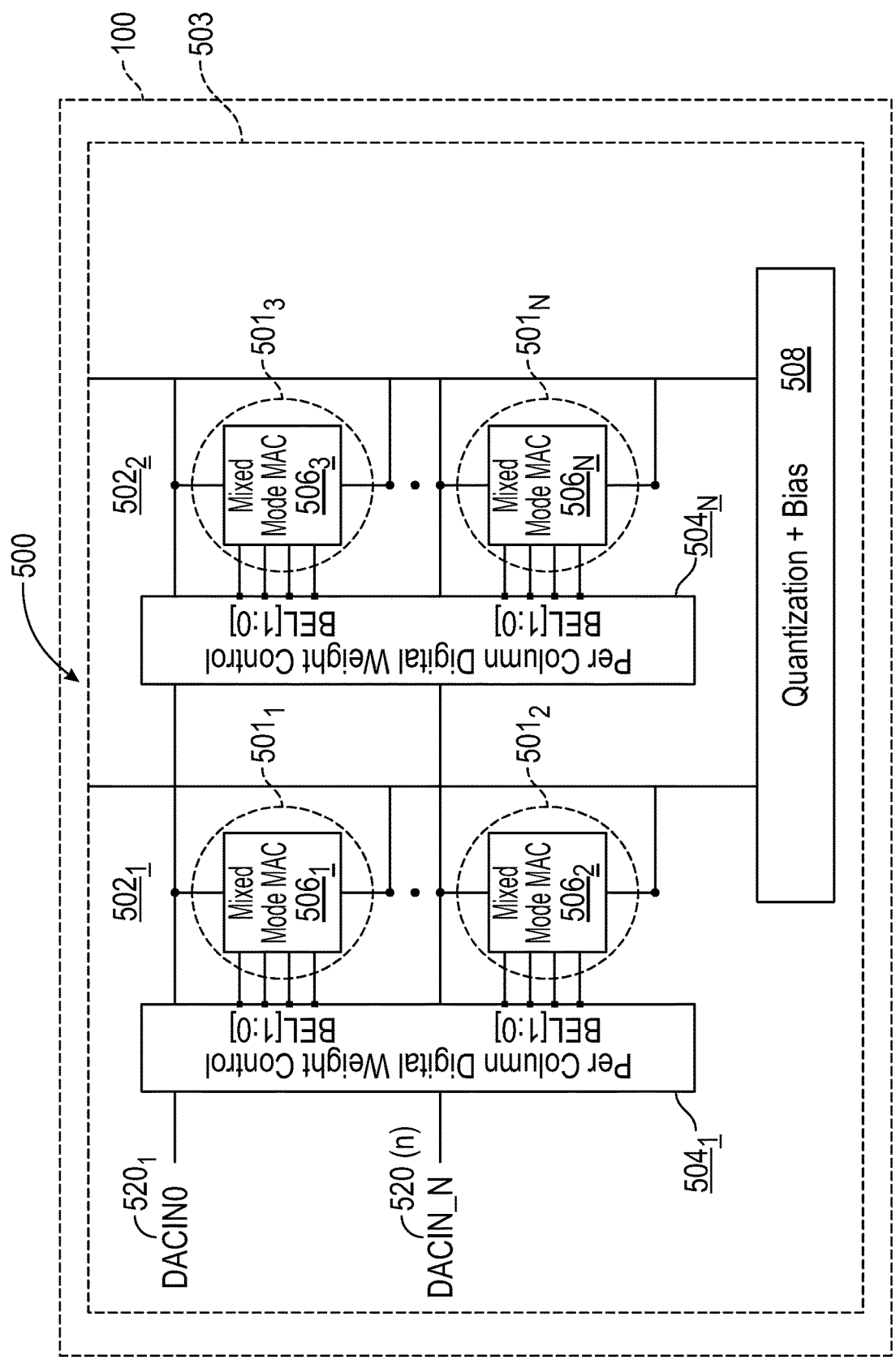
FIG. 5 is an architecture of a multiply-accumulate engine in accordance with an embodiment of the disclosure.

Referring now to FIG. 5, there is illustrated an architecture 500 of a MAC engine in accordance with an embodiment of the disclosure, where the MAC compute is singularly performed in an analog mixed-mode domain, and other operations are implemented in the digital domain. The architecture 500 includes a plurality of networks $501_1$, $501_2$, $501_3$, $501_N$, which are part of a network 503, which resides within the overall neural network 100 of FIGS. 1A and 1B. The number of $501_1$, $501_2$ ..., $501_N$ shown in the figure are illustrative. A crossbar architecture is not employed in this embodiment. Rather, each neuron as depicted in the illustrative embodiment, is split into multiple tiled columns $502_1$ and $502_2$. Here again, while two tiled columns $502_1$ and $502_2$ are shown for illustrative purposes, the tiled columns may be any suitable number. Digital logic via inputs DACIN0 ($520_1$) ... DACIN_N ($520_n$) are coupled to Per Column Digital Weight Control Logic Blocks $504_1$ and $504_N$. These configure respective weights in a plurality of Mixed-Mode MAC engines that form each network, which are characterized by blocks $506_1$, $506_2$, $506_3$, and $506_4$, each of which corresponds to the circuit 400 of FIG. 4. The MAC operation is performed using the known analog/mixed-signal (MX) approach, and the result is digitized on an ADC and output activations are generated at quantization and bias block 508. A single ADC may be further used to multiplex between the various neurons. Each column of the architecture 500 operates as an accumulator and each selected CeRAM equivalent bit-cell is operable as the MAC engine. In accordance with embodiments of the disclosure, the architecture digitally modulates the equivalent conductance of the individual networks $501_1$, $501_2$, $501_3$, $501_N$ among the plurality of networks to map the equivalent conductance of each individual network to a single weight W within the neural network 100 as shown in FIGS. 1A and 1B, where a first partial selection of weights within the neural network 300 is mapped into the equivalent conductances of the networks $501_1$, $501_2$, $501_3$, $501_N$ in the tiled columns $502_1$ and $502_2$ to enable the computation of multiply-and-accumulate operations by mixed-signal computation. The mappings are updated to select a second partial selection of weights to compute additional multiply-and-accumulate operations, and the mapping and computation operations are repeated until all desired computations for the neural network are completed.

In a variation of the above-described embodiment, the compact programmable MAC engine may also be provided in conjunction with a smaller fully-fixed equivalent, where the fully-fixed equivalent is configured to filter away DRAM traffic and operate as a conventional analog MAC-engine. This applies to most networks as it is no longer limited by the NVM capacity on chip. The fully-programmable analog MAC engine may also be switched on or enabled in the event of larger neural networks.

In summary, the present disclosure advantageously provides the following functionality:

Instead of mapping all weights to a crossbar, weights are streamed from external DRAM and the cross-bar is utilized to perform low-precision MAC-compute at very high efficiencies. Thus, embodiments of the disclosure split the "compute-in-memory" approach into merely a computation operation. It has been discovered that by using the resistor for computation alone, an increase in energy-efficiency is realized.

The NVM element is operable merely as a resistor, and non-volatility is not essential. Accordingly, embodiments in accordance with the disclosure may use poly-resistors, plastic electronics where there is no PMOS, and pull-up resistors.

The scheme disclosed herein uses the selector transistor to switch-in a specific weight value. This enables digital weight-reprogramming independent of explicitly reprogramming the NVM elements themselves, thereby significantly shrinking the area requirement. By enabling the reuse of the analog circuitry, it involves only instantiating a small number of ADCs/DACs, thus reducing the engineering complexity of the design.

The disclosed scheme of reuse enables the design to scale to substantially any network size, thereby reducing the restriction on the maximum size of the networks addressable by the analog mixed-signal approach.

Finally, this approach can be extended to magneto-resistive random-access memory (MRAM)-based crossbars.

Reference in the specification to "one embodiment" or "an embodiment" means that a particular feature, structure, or characteristic described in connection with the embodiment is included in at least one embodiment of the system. The appearances of the phrase "in one embodiment" in various places in the specification are not necessarily all referring to the same embodiment.

Embodiments of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

Some portions of the detailed descriptions, like the processes may be presented in terms of algorithms and symbolic representations of operations on data bits within a computer memory. An algorithm may be generally conceived to be steps leading to a desired result. The steps are those requiring physical transformations or manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "deriving" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The operations described herein can be performed by an apparatus. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk, read-only memories (ROMs), random access memories (RAMs), EPROMs, EEPROMs, magnetic or optical cards, or any type of media suitable for storing electronic instructions. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

In accordance with the foregoing, a method and architecture for multiply-accumulate operations in a network is disclosed.

Having thus described the disclosure of the present application in detail and by reference to embodiments thereof, it will be apparent that modifications and variations are possible without departing from the scope defined in the appended claims as follows:

1. A method of performing multiply-accumulate operations in a neural network, comprising:
for individual networks of a plurality of networks arranged in one or more tiled columns, an individual network including a plurality of selectable parallel elements and each parallel element having a predetermined conductance value:
digitally reprogramming an equivalent conductance of the individual network, said digitally reprogramming including selecting one or more of the parallel elements of the individual network to map the equivalent conductance of the individual network to a single weight of a first partial selection of weights within the neural network, where the predetermined conductance values of the plurality of selectable parallel elements are not altered by said digitally reprogramming;
computing multiply-and-accumulate operations by mixed-signal computation using the one or more tiled columns by applying an analog voltage across each network to produce a first resultant current in each tiled column;

for individual networks of the plurality of networks:
digitally reprogramming the equivalent conductance of the individual network, said digitally reprogramming including selecting one or more of the parallel elements of the individual network to map the equivalent conductance of the individual network to a weight of a second partial selection of weights of the neural network, where the predetermined conductance values of the plurality of selectable parallel elements are not altered by said digitally reprogramming;
computing multiply-and-accumulate operations by mixed-signal computation using the one or more tiled columns by applying an analog voltage across each network to produce a second resultant current in each tiled column; and
repeating-the reprogramming and computing operations until computations for the neural network are completed.

2. The method of claim 1, where the selection of weights are binary weights in conductances.

3. The method of claim 1, further comprising performing the multiply-and-accumulate computation in the neural network using the individual networks, and storing the weights external to the individual networks.

4. The method of claim 3, where individual networks in a tiled column are operable to singularly perform multiply-and-accumulate operations.

5. The method of claim 1, further comprising streaming the weights from an external memory.

6. The method of claim 5, where the external memory is one of a dynamic random-access memory and a pseudo-static random-access memory.

7. The method of claim 1, further comprising multiplexing the outputs of the respective tiled columns via an analog-to-digital converter.

8. The method of claim 1, where a neuron of the neural network is composed of a plurality of tiled columns.

9. The method of claim 1, where the plurality of selectable parallel elements of an individual network includes correlated electron random-access memory (CeRAM).

10. The method of claim 1, where one or more parallel elements of a network includes a resistor and a selector transistor, where the selector transistor is configured to switch the resistor in or out of an individual network in response to a selection signal.

11. An architecture for performing multiply-accumulate computation in a neural network, comprising:
a plurality of networks arranged in one or more tiled columns, each network including a plurality of selectable parallel elements and each parallel element having a predetermined conductance value;
logic configured to digitally program the equivalent conductance of individual networks among the plurality of networks, where:
said digitally programming includes, for each individual network, selecting one or more of the parallel elements of the individual network to map the equivalent conductance of the individual network to a single weight of a partial selection of weights of the neural network,
said digitally programming enables computation of multiply-and-accumulate operations by mixed-signal computation when a voltage bias is applied across networks in the one or more tiled columns, and
said digitally programming not alter the predetermined conductance values of the plurality of selectable parallel element; and
where the architecture is configured to compute multiply-and-accumulate operations for a plurality of programmed partial weight selections until computations for the neural network are completed.

12. The architecture of claim 11, where the plurality of selectable parallel elements in a network includes a plurality of transistors and resistors where the resistors have binary-weighted conductances.

13. The architecture of claim 11, where the selectable parallel elements include non-volatile memory elements and where weights of the neural network are stored external to the non-volatile memory elements.

14. The architecture of claim 13, where individual networks of a tiled column are operable to singularly perform multiply-and-accumulate computations.

15. The architecture of claim 11, further comprising an external memory disposed off-chip, where the plurality of weights are accessed from the external memory.

16. The architecture of claim 15, where the external memory is one of a dynamic random-access memory and a pseudo-static random-access memory.

17. The architecture of claim 11, further comprising an analog-to-digital converter operable to multiplex the outputs of the respective tiled columns.

18. The architecture of claim 11, where a neuron of the neural network is composed of a tiled column of the one or more tiled columns.

19. The architecture of claim 11, where the selectable parallel elements include a correlated electron random-access memory (CeRAM) operable to perform the multiply-accumulate operation.

20. The architecture of claim 11, where the neural network is of a size to be mapped entirely to the plurality of networks.

21. The architecture of claim 11, where one or more parallel elements of a network includes a resistor and a selector transistor, where the selector transistor is configured to switch the resistor in or out of an individual network in response to a selection signal.

* * * * *